United States Patent [19]

Tahernia et al.

[11] Patent Number: 5,058,204
[45] Date of Patent: Oct. 15, 1991

[54] SYNTHESIZED SELECTIVE CALL RECEIVER HAVING VARIABLE CHARACTERISTICS

[75] Inventors: Omid Tahernia, Coconut Creek; Walter L. Davis, Coral Springs; Barry W. Herold, Boca Raton, all of Fla.

[73] Assignee: Motorola, Inc., Schaumburg, Ill.

[21] Appl. No.: 551,669

[22] Filed: Jul. 13, 1990

Related U.S. Application Data

[63] Continuation of Ser. No. 388,459, Aug. 2, 1989, abandoned.

[51] Int. Cl.$^5$ .................. H04B 17/02; H04B 1/06
[52] U.S. Cl. .................. 455/183; 455/186; 455/260; 455/265; 455/266
[58] Field of Search .......... 455/183, 186, 200, 177, 455/228, 165, 260, 265, 266; 331/14, 1 A, 25; 340/825.44

[56] References Cited

U.S. PATENT DOCUMENTS

| | | | |
|---|---|---|---|
| 4,236,251 | 11/1980 | Ohgishi et al. | 455/186 |
| 4,247,952 | 1/1981 | Shibuya | 455/200 |
| 4,259,740 | 3/1981 | Snell et al. | 455/266 |
| 4,356,568 | 10/1982 | Ogita et al. | 455/266 |
| 4,429,279 | 1/1984 | Wycoff et al. | 455/266 |
| 4,479,091 | 10/1984 | Yoshisato | 455/266 |
| 4,479,257 | 10/1984 | Akiyama | 455/266 |
| 4,484,356 | 11/1984 | Geesen et al. | 455/200 |
| 4,528,523 | 7/1985 | Crowley | 331/14 |
| 4,528,698 | 7/1985 | Fraser | 455/266 |
| 4,792,993 | 12/1988 | Ma | 455/266 |

*Primary Examiner*—Reinhard J. Eisenzopf
*Assistant Examiner*—Andrew Faile
*Attorney, Agent, or Firm*—Daniel R. Collopy; Vincent B. Ingrassia; William E. Koch

[57] ABSTRACT

A paging receiver has a synthesizer for governing the receive frequency. The paging receiving further has characteristics which are varied in response to the receive frequency. These characteristics include varying the bandwidth of a loop filter within a phase lock loop within the synthesizer as well as varying the time in which a detector circuit used to extract a DC level from a recovered audio signal is disabled. Furthermore, the bandwidth of the loop filter is varied in response to switching from a first receive frequency to a second receive frequency in order to provide for either a uniform frequency lock time or for a rapid frequency lock time. Furthermore, the time in which the detector circuit is disabled is correspondingly changed.

14 Claims, 2 Drawing Sheets

SYNTHESIZED SELECTIVE CALL RECEIVER HAVING VARIABLE CHARACTERISTICS

This is a continuation of application Ser. No. 388,459, filed 08/02/89 now abandoned.

BACKGROUND OF THE INVENTION

This invention relates in general to a selective call receiver having a frequency synthesizer for changing receive frequencies in order to receive a paging signal. This invention more specifically relates to varying characteristics of the receiver in response to the receive frequency.

A paging receiver which receives a paging signal on one of a plurality of receive frequency channels, needs to switch between receive frequency channels. However, the lock time of a frequency synthesizer having a phase lock loop (PLL) may vary depending upon the differences in frequency between two channels. It is desirable to provide a constant lock time when switching channels regardless of the differences in frequency. Furthermore, it is desirable to lock to another channel very rapidly in one instance while the lock time may not be critical in another instance. Thus it is desirable to vary the characteristics of a selective call receiver in order to provide for a desired lock time.

The loop filter of the PLL also effects the noise level of the synthesized frequency used within a superheterodyne receiver, the noise level effects the selectivity of the receiver. Different applications of paging receivers or different channels upon which paging receivers receive paging signals may require differing selectivity performance. Thus it is desirable to adjust the loop bandwidth of a PLL in order to provide a desired level of selectivity performance.

During the reception process, a demodulated signal has a DC component and an AC component upon which the paging signal is included. The DC component is removed in order to digitize the AC component. A complex circuit is used to determine and extract the DC component, such a circuit is shown in U.S. Pat. No. 4,631,737 to Davis et al. It is desirable to disable this circuit while the PLL is acquiring lock.

SUMMARY OF THE INVENTION

It is therefore an object of the invention to provide for the aforementioned desirable ends.

In accordance with the present invention, a selective call receiver comprises a receiving means for receiving and demodulating a selective call signal, said receiving means including a phase lock loop (PLL) for programmably generating an injection frequency used to select a receive frequency for receiving the selective call signal, said receiving means further having a variable characteristic, and a decoding means for processing the demodulated selective call signal and for programming the frequency of the PLL and for varying the characteristic of the receiving means in response to the programmed frequency.

DESCRIPTION OF A PREFERRED EMBODIMENT

Figure 1:
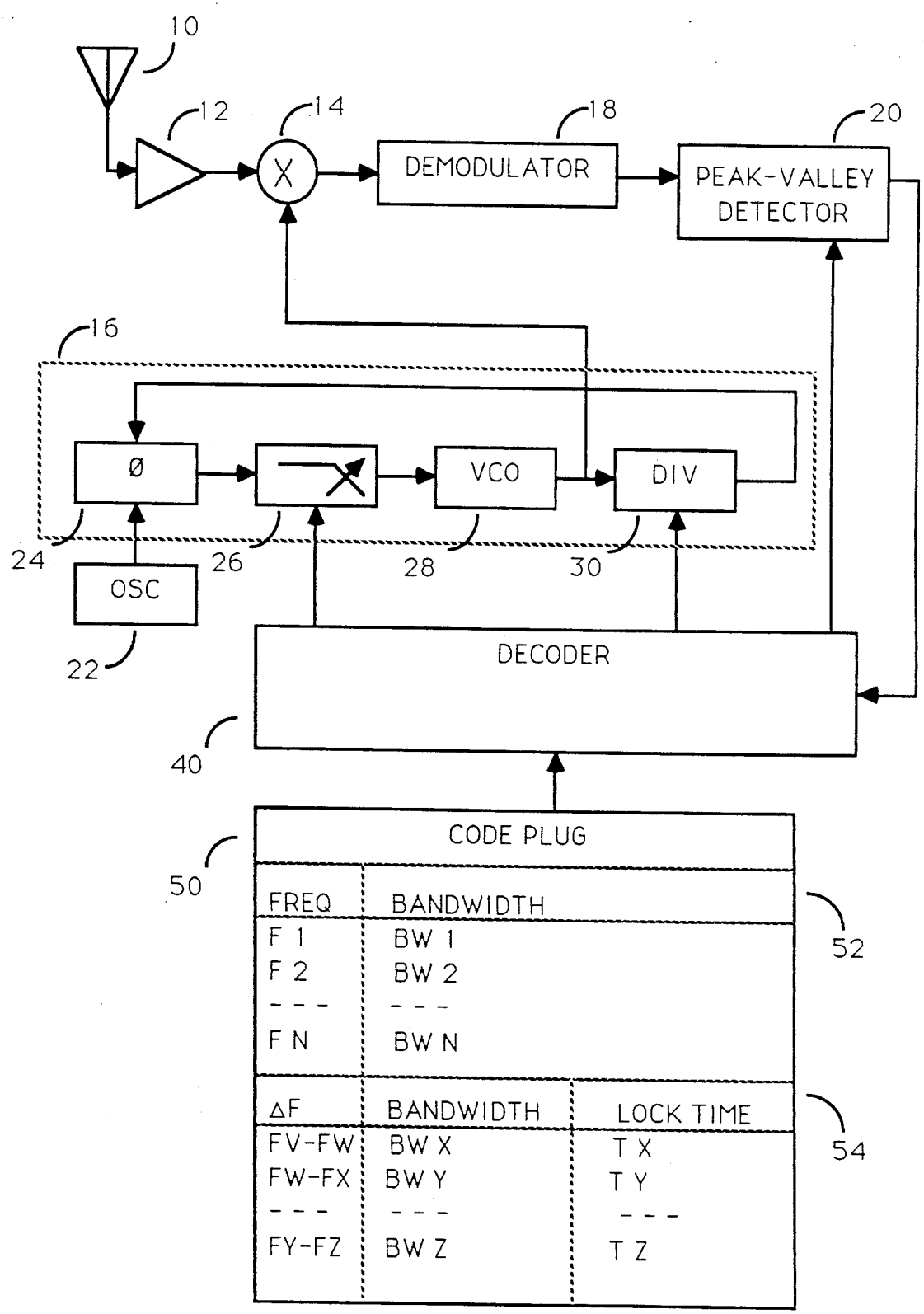
FIG. 1 shows a paging receiver operating in accordance with the present invention.

FIG. 1 shows a paging receiver operating in accordance with the present invention. RF modulated paging signals are received on antenna 10, amplified by amplifier 12 mixed by mixer 14 with an injection frequency from synthesizer 16 in order to create an intermediate frequency signal. Demodulator 18 generates an audio signal from the intermediate frequency signal. The audio signal is digitized by the peak and valley detector 20 which generates a digital signal from the audio signal. Peak and valley detector 20 is described in U.S. Pat. No. 4,631,737 to Davis et al. which is hereby incorporated by reference.

Synthesizer 16 comprises a phase lock loop (PLL) and is driven by a reference frequency from oscillator 22. The reference frequency is compared by phase comparator 24. The output of the phase comparator is filtered by a programmable loop filter 26 which is described in U.S. patent application Ser. No. 07/345,809 now U.S. Pat. No. 4,901,033 to Herold et al. and assigned to the assignee of the present invention which provides for a variable filter characteristic. The output of the loop filter is coupled to voltage controlled oscillator 28 which generates the injection frequency. The injection frequency is further coupled to programmable divider 30 the output of which is coupled to phase comparator 24, thus closing the loop of the PLL.

Decoder 40 receives and processes the digitized signal from peak and valley detector 20 and also enables and disables the peak and valley detector. Programmable filter 26 and programmable divider 30 are also programmed by decoder 40. Decoder 40 includes a microcomputer for performing its functions. Use of a microcomputer or control functions of a paging receiver is known in the art. A preferred microcomputer is the MC68HC05C4 microcomputer manufactured by Motorola Inc. Some elements of the invention described herein are implemented in software operating within the microcomputer.

Code plug 50 includes several variables used to vary the characteristics of the receiver in response to the receive frequency. A first portion 52 contains frequency information and corresponding loop bandwidth information. A second portion 54 contains the change in frequency information, $\Delta F$ and corresponding bandwidth and lock time information.

For example, if substantial selectivity was required at a first frequency of 131.000 MHz, nominal selectivity was required at a second frequency of 132.000 MHz and selectivity was not critical at 133.000 MHz, table 52 for the paging receiver of this example could read:

| | |
|---|---|
| F1 = 131.000 MHz | BW1 = 50 Hz |
| F2 = 132.000 MHz | BW2 = 75 Hz |
| F3 = 133.000 MHz | BW3 = 120 Hz |

The frequencies above indicate receive frequencies, alternately the injection frequency, which differs from the receive frequency by the intermediate frequency, could be used, while maintaining the same bandwidths. Table 52 governs the loop bandwidth while the PLL is locked.

Table 54 governs the loop bandwidth during lock acquisition and table 54 further governs the lock time provided by the decoder. A relationship exists between the loop bandwidth and the lock time. The relationship is characterized and stored in the codeplug for use by the decoder. The following example uses the above frequencies for table 54.

| ΔF | BW | LOCK TIME |
| --- | --- | --- |
| F1-F2 | 330 Hz | 10 mS |
| F2-F3 | 330 Hz | 10 mS |
| F3-F1 | 660 Hz | 10 mS |
| F1-F2 | 570 Hz | 5 mS |
| F1-F2 | 75 Hz | 25 mS |
| FS-F1 | 130 Hz | 10 mS |
| FS-F2 | 330 Hz | 10 mS |
| FS-F3 | 570 Hz | 10 mS |

The first three rows show progression from F1-F3 and back to F1, much like a scanning receiver would operate while scanning channels F1, F2, and F3. The values provide for maintaining a constant lock time independent of the distance in MHz of the frequencies. In order to provide for switching from F1 to F2 or from F2 to F3 with a 10 mS lock time, a 330 Hz bandwidth is used for the loop filter. However, when switching from F3 to F1, a frequency jump twice as far as the prior two, the bandwidth is widened to 660 Hz in order to maintain the constant 10 mS lock time. The fourth and fifth rows show changing the bandwidth in order to provide for faster or slower lock times respectively. These rows may be used in response to commands within the paging signal causing the pager to switch from F1 to F2. The final three rows show starting from a starting frequency FS and bandwidth required to lock on to F1 through F3 respectively in 10 mS. The starting frequency, FS is indicative of the free running frequency of the VCO when it is initially powered on. Thus these rows are used when power is initially applied to the receiver which corresponds to the pager being brought out of the battery saving state.

Figure 2:
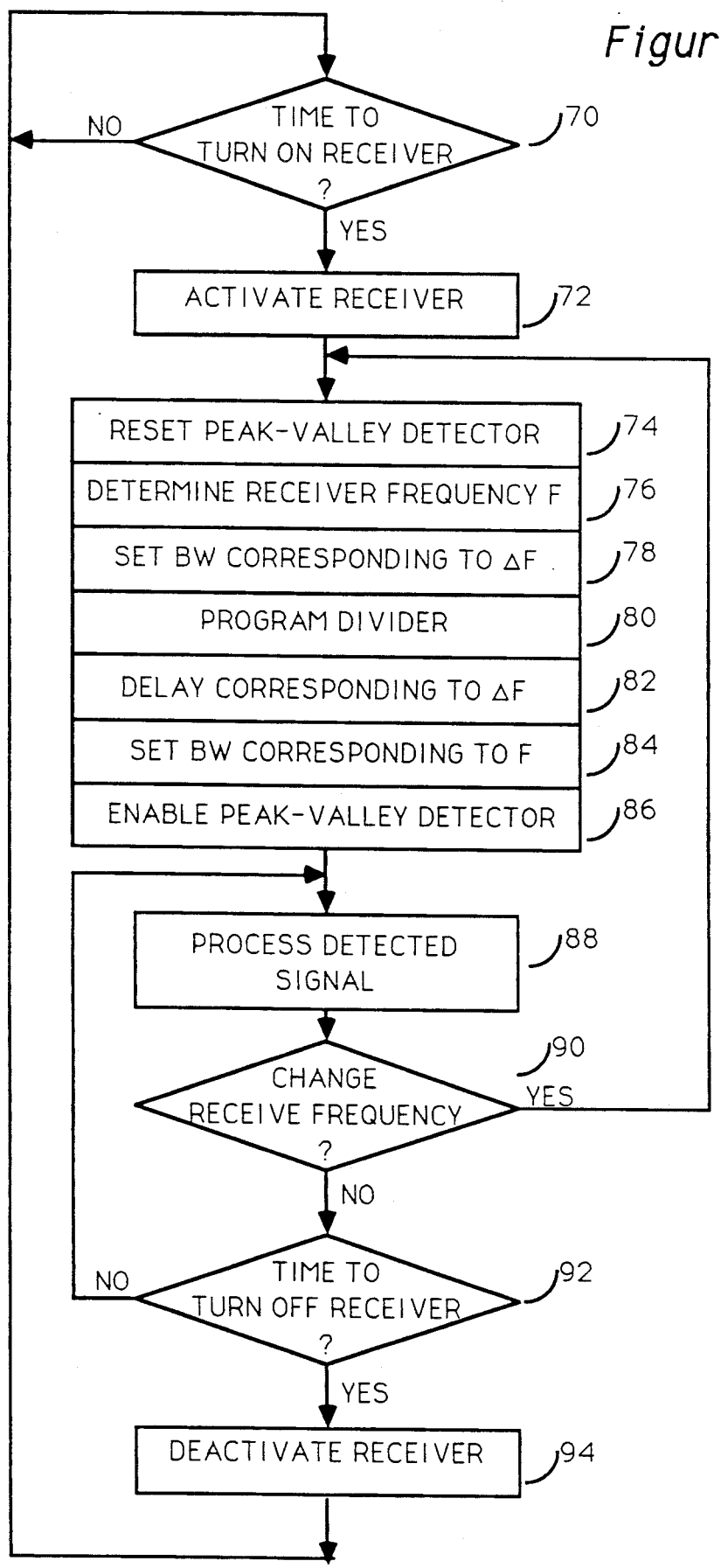
FIG. 2 shows a flow chart of a decoder operating in accordance with the present invention.

FIG. 2 shows a flowchart of a decoder operating in accordance with the present invention. The flowchart begins in step 70 with the receiver in the battery save state, thereby disabled. Step 70 is executed until it is time to turn the receiver on. Then in step 72 the receiver is activated or turned on, thereby exiting the battery saving state. Then in step 74 the peak and valley detector is reset. Step 76 determines the receiver frequency which may be made by one of several known algorithms. One such algorithm is shown in U.S. Pat. No. 4,644,347 Feb. 17, 1987 to Lucas et al. which is hereby incorporated by reference. Step 78 determines the loop bandwidth with which to program loop filter 30. For example say from step 76, the determined frequency was F3, since the VCO was just previously enabled, it is free running thus the decoder selects the bandwidth corresponding to FS-F3 from the table above (570 Hz). The divider 30 is then programmed in order to receive frequency F3. Then a delay is executed by the software as determined by the FS-F3 lock time entry in the codeplug (1.0 mS from the above table). Then in step 84, the bandwidth of the loop filter 26 is changed to correspond to the desired bandwidth of frequency F3 (120 Hz from the table above). After the delay of step 82, the peak and valley detector 20 is enabled.

Thereafter the receiver detects valid digitized information and in step 88 the decoder processes the detected signal. Step 90 checks if the frequency is to be changed, which could be in response to a signal received by the receiver. If the frequency is not to be changed, step 92 checks if it is time to turn off the receiver, a decision which may be made after completing reception of a paging signal. If it is not time to turn the receiver off, step 80 is returned to and signal processing continues. If it is time to turn the receiver off, step 94 deactivates the receiver thereby entering the battery save mode and step 70 is executed.

If in step 90, it was decided it was time to change to a new receive frequency, step 74 would be executed. The peak and valley detector would be reset and the next frequency would be determined. If for example, the pager was in the scanning mode, currently receiving F3, and F1 was the next frequency to be scanned, information from the F3-F1 row of the above table would be used in steps 78-86. If for example, the receiver was receiving F1 and detected a paging signal directing the pager to rapidly switch to F2, the receiver would use the 5mS lock time setting from the F1-F2 row of the table above in steps 78-86.

Note that the programmable loop filter draws higher current when operating in the wider bandwidth, so it is generally desirable to use narrower bandwidths when possible. Furthermore, narrower bandwidths provide for reduced phase noise which may be desirable.

Although the invention has been described by way of example, it should be clear that numerous alternate applications of the principles described herein may be implemented while remaining within the scope of the invention which is defined by the following claims.

What is claimed is:

1. A selective call receiver cable of switching from a first receiver frequency to a second receive frequency comprising:

receiving means for receiving and demodulating a selective call signal, said receiving means having a plurality of selectable characteristics and said receiving means including a phase lock loop (PLL) for programmably generating an injection frequency used to select the first or second receive frequency for receiving the selective call signal, said PLL comprising a loop filter having a multiplicity of selectable characteristics of the receiving means results from the selection of one of said multiplicity of selectable bandwidths;

determining means for determining the difference between a first injection frequency corresponding to the first receive frequency and a second injection frequency corresponding to the second receive frequency, the determining means generating a difference signal in response thereof;

memory means for storing at least one delta bandwidth signal corresponding to the difference signal; and decoding means for processing the demodulated selective call signal and for programming the PLL to produce a programmed frequency and for selecting a first one of the multiplicity of selectable bandwidths of the loop filter in response to the programmed frequency and the delta bandwidth signal and for switching the PLL from generating the first to generating the second injection frequency.

2. The selective call receiver of claim 1 wherein said memory means further stores at least one lock time delay signal, wherein each of the at least one lock time delay signal corresponds to one of the at least one delta bandwidth signal stored in said memory means, said selective call receiver further comprising:

delay means for initiating a time delay in response to said decoding means switching the PLL from generating the first to generating the second injection frequency and for generating a completion signal in response to completion of the timed delay, the time delay having a time duration corresponding to one of the at least one lock time delay signal associated with the difference signal, and wherein said decoding means having hitherto programmed the PLL to generate the first injection frequency and selected the first one of the multiplicity of selectable bandwidths, programs the PLL to generate the second injection frequency and further selects a second one of the multiplicity of selectable bandwidths in response to the completion signal.

3. The selective call receiver of claim 1 wherein said receiving means produces the demodulated selective call signal having DC and AC components and further wherein said receiving means includes:

detecting means for detecting and removing the DC component; and converting means for digitizing the AC component, thereby generating a digital signal including the selective call signal, for processing by the decoding means, and wherein the selective call receiver further comprises:

delay means for initiating a timed delay in response to said decoding means programming the PLL to generate the second injection frequency and generating a completion signal in response to completion of the timed delay, the time delay having a time duration provided to said delay means by said decoding means, wherein said decoding means determines said time duration in response to the second injection frequency and enables the detecting means in response to the completion signal.

4. The selective call receiver of claim 3 wherein said memory means further stores at least one lock time delay signal corresponding to the second injection frequency, and wherein said decoding means determines said time duration in response to one of the at least one lock time delay signal stored within said memory means, said one of the at least one lock time delay signal corresponding to the second injection frequency and the delta bandwidth signal.

5. The selective call receiver of claim 3 wherein said memory means further stores at least one lock time delay signal corresponding to the difference signal, and wherein said decoding means, having hitherto programmed the PLL to generate the first injection frequency, disables said detecting means and programs the PLL to generate the second injection frequency, said decoding means determining said time duration in response to one of the at least one lock time delay signal corresponding to the second injection frequency, and subsequently enabling said detecting means in response to the completion signal.

6. A method of controlling a selective call receiver for receiving radio frequency modulated information, said selective call receiver having a plurality of selectable characteristics and including a memory device and a frequency synthesizer, the frequency synthesizer for generating an injection frequency to select a receive frequency and including a loop filter having a multiplicity of selectable bandwidths, the method comprising the steps of:

selecting a first receive frequency;

selecting one of the plurality of selectable characteristics in response to the selected first receive frequency;

switching from the first receive frequency to a second receive frequency.

determining the difference between a first injection frequency corresponding to the first receive frequency and a second injection frequency corresponding to the second receive frequency;

generating a difference signal in response thereof;

selecting one of the multiplicity of selectable bandwidths of the loop filter in response to one of at least one delta bandwidth signal corresponding to the difference signal, said at least one delta bandwidth signal stored in the memory device; and switching the frequency synthesizer from generating the first to generating the second injection frequency.

7. The method according to claim 6 wherein the memory device has stored therein the at least one delta bandwidth signal and a lock time delay signal associated with the difference signal, the method further comprising after the step of switching the frequency synthesizer the steps of:

initiating a timed delay, the timed delay having a time duration corresponding to the lock time delay signal;

generating a completion signal in response to completion of the programmed delay; and selecting a second loop filter bandwidth in response to the completion signal.

8. The method according to claim 6 further comprising before the step of selecting a first receive frequency the steps of:

receiving a selective call signal having an AC component; and digitizing the AC component to generate a digital signal, the digital signal comprising the radio frequency modulated information; and the method further comprising after the step of switching the frequency synthesizer the steps of:

initiating the timed delay in response to the switching of the frequency synthesizer from generating the first to generating the second injection frequency; and generating a completion signal in response to completion of the timed delay.

9. The method according to claim 6 wherein said memory device further stores at least one lock time delay signal corresponding to the second injection frequency; and wherein said method further comprises the step of initiating a timed delay having a time duration, the time duration determined in response to the at least one lock time delay signal.

10. An electronic device comprising:

circuit means for generating an operating signal, said circuit means including a phase lock loop (PLL) for programmably generating a reference frequency for generating the operating signal, wherein the PLL includes a loop filter having a multiplicity of selectable bandwidths, and wherein selection of one the multiplicity of selectable bandwidths results in selection of one of the plurality of selectable characteristics, said circuit means further having a plurality of selectable characteristics and said circuit means capable of switching from a first reference frequency to a second reference frequency;

processor means for processing the operating signal and for programming the PLL to generate a programmed frequency and for selecting one of the plurality of selectable characteristics of the circuit means in response to the programmed frequency;

determining means for determining the difference between a first operating frequency corresponding to the first reference frequency and a second operating frequency corresponding to the second reference frequency, the determining means generating a difference signal in response thereof; and memory means for storing at least one delta bandwidth signal corresponding to the difference signal, wherein said processor means selects one of the multiplicity of selectable bandwidths of the loop filter corresponding to the delta bandwidth signal and switches the PLL from generating the first reference frequency to generating the second reference frequency.

11. The electronic device of claim 10 further comprising:

delay means for generating a completion signal in response to the completion of a timed delay, wherein said memory means further stores a lock time delay signal associated with the difference signal, and said processor means having hitherto programmed the first operating frequency and selected a first of said multiplicity of selectable bandwidths, provides a time duration to the delay means, the time duration determined in response to the lock time delay signal, and the processor means programs the second operating frequency and coincidentally signals the delay means to initiate the timed delay for the time duration, and the processor means further selects a second of said multiplicity of selectable bandwidths in response to the completion signal.

12. The electronic device of claim 10 wherein said circuit means produces a demodulated signal having DC and AC components and further wherein said circuit means includes:

detecting means for removing the DC component; and converting means for digitizing the AC component to produce the operating signal for processing by the decoding means, the detecting means being enabled in order to determine the DC component of the demodulated signal, and the electronic device further comprises:

delay means for generating a completion signal in response to the completion of a timed delay, wherein said processor means signals said delay means to initiate said timed delay for a time duration in response to the programming of the second operating frequency, the time duration determined by the processing means in response to the second operating frequency, and the processing means enables the detecting means in response to the completion signal.

13. The electronic device of claim 12 wherein said memory means further stores at least one lock time delay signal corresponding to the second operating frequency, and wherein said decoding means determines said time duration in response to one of the at least one lock time delay signal corresponding to the difference signal.

14. The electronic device of claim 12 wherein said memory means further stores at least one lock time delay signal corresponding to the difference signal, and wherein said processing means, having hitherto programmed the first operating frequency, disables said detecting means, programs the second operating frequency, determines said time duration in response to the lock time delay signal, and enables said detecting means in response to the completion signal.

* * * * *

UNITED STATES PATENT AND TRADEMARK OFFICE
CERTIFICATE OF CORRECTION

PATENT NO. : 5,058,204

DATED : October 15, 1991

INVENTOR(S) : Tahernia et al.

It is certified that error appears in the above-identified patent and that said Letters Patent is hereby corrected as shown below:

In claim 1, at col. 4 line 31 after "receiver", delete "cable" and insert therefor --capable--.

In claim 1, at col. 4 line 32 after "first", delete "receiver" and insert therefor --receive--.

In claim 1, at col. 4 line 42 after "selectable", insert --bandwidths,wherein each of said plurality of selectable--.

In claim 2, at col. 5 line 1, delete "time" and insert therefor --timed--.

Signed and Sealed this

Twenty-second Day of September, 1992

*Attest:*

DOUGLAS B. COMER

*Attesting Officer*   *Acting Commissioner of Patents and Trademarks*